June 11, 1963 V. J. LYONS 3,093,517

INTERMETALLIC SEMICONDUCTOR BODY FORMATION

Filed June 30, 1959

INVENTOR
VINCENT J. LYONS

BY Alvin J. Riddles
ATTORNEY

3,093,517
INTERMETALLIC SEMICONDUCTOR BODY FORMATION

Vincent J. Lyons, Wappingers Falls, N.Y., assignor to International Business Machines Corporation, New York, N.Y., a corporation of New York Filed June 30, 1959, Ser. No. 823,973
3 Claims. (Cl. 148—1.5)

This invention relates to semiconductor materials and in particular to semiconductor materials of the intermetallic type that are compounds of more than one element.

The intermetallic compound semiconductors have a number of advantages in semiconductor device manufacturing including improved performance with greater variations in operating temperatures. As the art has developed, problems associated with the manufacture of semiconductor device structures wherein differences in conductivity type caused by the introduction in very tiny quantities of conductivity type determining impurities and the gradations of the concentrations of those conductivity type determining impurities throughout particular conductivity type zones, in the intermetallic semiconductor structures can become increasingly difficult to handle due to the fact that there are wide variations in the physical properties of the impurities involved, and in the physical properties of the elements that go to make up the compound.

What has been discovered is a technique of forming semiconductor devices wherein some of the physical properties of the elements that go to make up the compound in an intermetallic semiconductor are employed to control a quantity of intermetallic semiconductor that forms as a single crystal in the fabrication of an individual structure.

It is an object of this invention to provide a method of causing epitaxial growth of plural element semiconductor compounds by moving the composition of a molten alloy of a plural element semiconductor compound that melts at a temperature less than that of the compound in stoichiometric proportions in the direction of stoichiometry at a temperature less than that required to melt the compound in stoichiometric proportions.

It is an object of this invention to provide an improved method of forming intermetallic semiconductor structures.

It is another object of this invention to provide an improved method of forming PN junctions in intermetallic semiconductors.

It is still another object of this invention to provide a technique of alloy formation of intermetallic semiconductors.

It is another object of this invention to provide an improved zinc arsenide ($ZnAs_2$) semiconductor structure.

It is still another object of this invention to provide an improved opposite conductivity type zone in a zinc arsenide ($ZnAs_2$) semiconductor structure.

The foregoing and other objects, features and advantages of the invention will be apparent from the following more particular description of a preferred embodiment of the invention as illustrated in the accompanying drawings.

Figure 1:
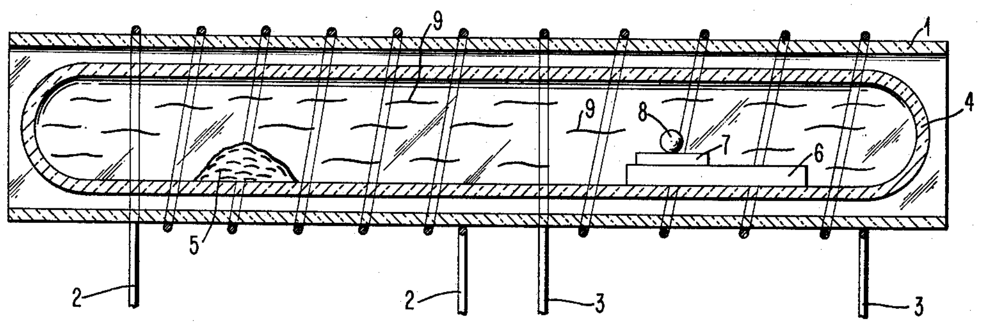
FIGURE 1 is a sketch of an apparatus illustrating the practice of the invention.

Referring now to FIGURE 1, an apparatus is shown illustrating the practicing of the invention. The apparatus comprises a two temperature zone furnace made up of a support element such as a quartz tube 1, around which are wrapped two resistance type heating elements 2 and 3 which by applying power thereto, serve to control the temperature in individual portions of the furnace. Inside the tube 1 is placed a sealed reaction container 4, generally of quartz.

A large majority of the intermetallic compound semiconductors are composed of elements that are different in volatility. In practicing the invention, an intermetallic compound semiconductor is selected with a difference in volatility between the elements. The furnace has in one site, under the coil 2 a quantity 5 of the more volatile element of the intermetallic semiconductor compound and, in the other site of the furnace, under the coil 3, a suitable base 6, such as a graphite block is provided. A monocrystalline quantity of the intermetallic semiconductor material is positioned on the base 6 and serves as a substrate 7. On the substrate 7 a quantity of an alloy 8 is positioned. The alloy 8 contains the elements of the intermetallic semiconductor material, and, in addition the alloy is rich in the element of the intermetallic semiconductor that has the lower volatility, further, in accordance with the invention, the alloy 8 has a melting point that is lower than that of the intermetallic semiconductor material in stoichiometric proportions. In stoichiometric proportions the elements are present in their atomic weight proportions.

Under these circumstances, when power is applied to the coil 3, the temperature may be raised to a point where the alloy 8 will melt but at that temperature the stoichiometric intermetallic material 7 will not melt. When power is applied to the coil 2, a quantity of the more volatile constituent of the intermetallic compound from the source 5 is vaporized and the molten alloy 8 absorbs the higher volatility element from the gas 9. Under these conditions, since the molten alloy 8 has an excess of the other, the less volatile constituent of the intermetallic compound, when the alloy 8 absorbs quantities of the second, the more volatile, constituent from the gas 9 the alloy 8 composition moves toward stoichiometry. Since the alloy 8 is being maintained at a temperature lower than the temperature required to melt the stoichiometric compound, the alloy in order to maintain equilibrium, is forced to precipitate quantities of the intermetallic compound. This precipitate occurs in the form of a growth of monocrystalline intermetallic semiconductor material on the substrate 7 in an epitaxial manner wherein the crystalline orientation and periodicity of the substrate 7 is maintained. The growth is continued until the excess of the non-volatile constituent of the intermetallic compound or the volatile element 5 in the gas 9 is exhausted.

Through proper control of conductivity type determining impurities, either in the alloy 8 or in the gas 9, it is possible to provide PN junctions and gradations of resistivity in the solidified semiconductor material. The quantities of impurities involved, being generally less than 0.001 percent in most semiconductor material, are not of sufficient quantity to appreciably alter the melting temperature of the alloy 8.

Figure 2:
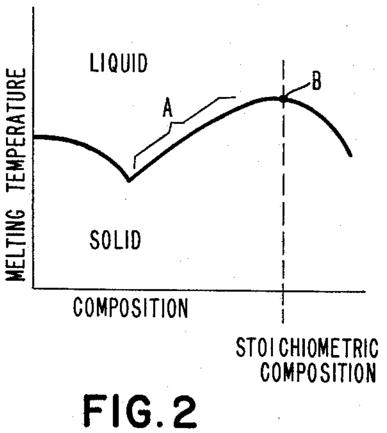
FIGURE 2 is a graph illustrating the melting temperature versus the composition of intermetallic semiconductors employed in the invention.

Referring next to FIGURE 2 a graphic illustration is provided of the conditions under which the intermetallic semiconductor body is formed. In FIGURE 2 the graph is a plot of the composition of the intermetallic compound as the abscissa and the melting temperature as the ordinate.

The stoichiometric composition value is shown dotted and is illustrated as the highest melting point alloy. In practice, however, it is necessary only that an alloy be available in the system that is rich in the less volatile element and which melts at a temperature lower than the melting temperature of the stoichiometric compound semiconductor material in stoichiometric proportions.

In FIGURE 2, the alloy such as 8 in FIGURE 1 is made up of an alloy containing an excess of the less volatile constituent and is such that the melting temperature is in the section of the curve illustrated as A wherein the melting temperature of the less volatile constituent rich alloy of the compound is less than that of the compound in stoichiometric proportion, which melting point is labelled point B on the graph. Under these conditions, any alloy along the section traversed by the curve and described by the section A, will operate to precipitate solid stoichiometric material should the constituents of the alloy depart from the value they have, in the direction of stoichiometry, while the temperature is held lower than the stoichiometric melting point.

While the graph of FIGURE 2 has been shown with a eutectic alloy composition, it will be apparent to one skilled in the art that the presence of a eutectic in the system is not an essential so long as there is a point wherein an alloy exists that is rich in the less volatile constituent and that alloy has a melting point which is lower than the melting point of the compound in stoichiometric proportions. In principle, the technique of this invention may be used on any compound which exhibits thermal dissociation and is characterized by a melting point maximum.

Figure 3:
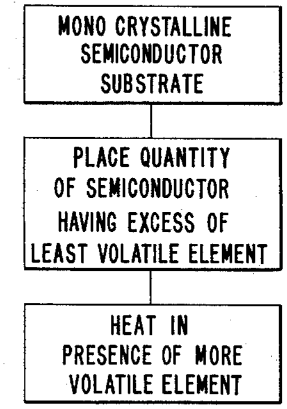
FIGURE 3 is a flow chart employed in the practice of the invention.

Referring next to FIGURE 3, a flow chart is shown of the process of the invention. In the flow chart, in a first step, a monocrystalline binary compound semiconductor substrate is provided. The substrate is appropriately etched to provide a clean surface for growth, and, in referring to FIGURE 1, is shown as element 7. On the substrate in the second step a quantity of an alloy of the binary compound semiconductor in which stoichiometry is not maintained, preferably by having an excess of the least volatile element, is provided in an arrangement such that the melting point of the alloy is lower than the melting point of the compound in stoichiometric proportions. The temperature is then raised in the vicinity of the substrate in the presence of a gaseous environment containing a quantity of an element or elements capable of returning the alloy when absorbed therein, toward stoichiometry. This is best accomplished by providing in the gas a concentration of the more volatile element of the binary compound. Under these conditions the more volatile element is absorbed by and enters the less volatile element rich liquid alloy thereby changing the composition relationship of the elements of the binary intermetallic compound in the alloy. This tends to move the composition of the compound alloy in the general direction of stoichiometry. The change in composition in the direction of stoichiometry, while at a fixed temperature operates to cause the intermetallic semiconductor material to precipitate out of the molten alloy and to grow epitaxially on the semiconductor substrate 7. Where it is desired to introduce conductivity type determining impurities, these may be introduced from a separate source and may be vaporized with the gas 9 of FIGURE 1.

The formation of PN junctions may be accomplished by making the substrate of one conductivity type and providing the source 5 with impurities of the opposite conductivity type, or by introducing impurities from a separate location. With a separate heating source similar to element 2 or 3, the amount of the impurity vaporized may be so controlled that the concentrations may be made to vary in the epitaxially grown semiconductor material, thereby producing a gradient of impurity concentration in the semiconductor material.

In order to aid in understanding and practicing the invention, the following set of specifications are provided for a specific plural element intermetallic compound. The binary intermetallic semiconductor compound, zinc arsenide has been chosen ($ZnAs_2$), as a typical example, it being understood that no limitation is to be construed hereby since in the light of the invention, many similar sets of specifications for particular compound semiconductor materials may be provided.

A wafer of N type monocrystalline zinc arsenide ($ZnAs_2$) is placed in a sealed container as illustrated in FIGURE 1 on a graphite support 6. A small quantity 8, approximately 2 milligrams of a zinc arsenide $ZnAs_2$—$Zn_3As_2$ alloy of composition 60% arsenic, 40% zinc is placed on the surface of the monocrystalline zinc arsenide ($ZnAs_2$) 7. The elements are then placed in a quartz tube and sealed along with a quantity 5 of high purity arsenic. The tube is filled with hydrogen to a pressure of 100 millimeters absolute and then sealed. The reaction tube 4 is placed in a two-temperature heating furnace as shown in FIGURE 1. The temperature is increased to approximately 660° C. which vaporizes arsenic 5 into the gas 9 and gives an arsenic pressure of about 3 atmospheres. This is done to minimize the dissociation of the zinc arsenide ($ZnAs_2$) and, to provide an arsenic source for subsequent absorption by the alloy 8. Simultaneously, the temperature of the substrate 7 location of the furnace is increased to approximately 740° C. by providing more power to coil 3. After the establishment of an equilibrium by the corrective mixing of the gas 9 throughout the furnace, the temperature of the substrate 7 location of the furnace is slowly increased at a constant rate by further applying power to coil 3 until the melting point of the alloy B of $ZnAs_2$, $Zn_3As_2$ composition, about 755° C. is reached. This point is best determined in the absence of extensive calibration, by using transparent furnace materials and observing the melting of the alloy. The temperature is maintained at about 760° C. for about one half hour. The temperature of the substrate 7 location of the furnace is then slowly decreased and the molten alloy 8 material solidified on the surface of the substrate 7. After removing the semiconductor body thus formed from the furnace, thermoelectric probing indicates the region under the alloy to be P type. This is normal for zinc arsenide ($ZnAs_2$) to which no impurities have been added. Solder contacts are made to the P type region and the original wafer 7 being an N type region, a rectifying diode is thus formed.

Figure 4:
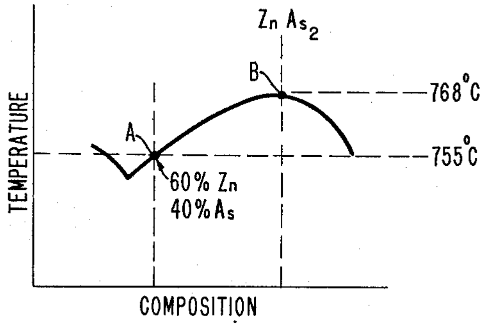
FIGURE 4 is a an alloy illustrating the practice of the invention in connection with an individual example.

Referring now to FIGURE 4, a curve similar to that shown in FIGURE 2 is provided for zinc arsenide ($ZnAs_2$) to enable one skilled in the art to become acquainted with orders of magnitude involved. In the curve of FIGURE 4, the point A for the above example is shown as the alloy 60% zinc, 40% arsenic having a melting temperature of 755° C. and the point B is the stoichiometric compound of zinc arsenide ($ZnAs_2$) having a melting temperature of 768° C. As may be seen from the above examples and discussion, the alloy composition must be rich in one of the binary elements that is less volatile, and that the alloy composition must melt before the stoichiometric proportions of the binary compound are reached. The difference in vapor pressure which is a measure of the volatility of the individual elements in the binary systems that is required to practice the invention is governed primarily by the regulation in the system. In other words, if the difference in vapor pressure between the two elements in the binary compound is small, the regulation in the system must be great in order to take advantage of the difference. For an example, cadmium arsenide ($Cd_3As_2$) is an example of a difficult to work with semiconductor material, in that the vapor pressures of the cadmium and the arsenic are very close to being equal, so that very precise temperature and pressure regulation in the system is required. On the other hand, the group III–V intermetallic compounds such as indium antimonide are characterized by substantial differences in vapor pressure between the elements of the binary compound and are considerably easier to work with.

What has been described is a technique of growing intermetallic semiconductor crystals involving compounds semiconductor materials wherein an alloy that is rich in a less volatile element of the compound, that melts at a temperature lower than the melting temperature of the compound in stoichiometric proportions is placed in molten condition in contact with a monocrystalline substrate and a quantity of the more volatile element of the compound is introduced into the liquid alloy from a gaseous environment while the temperature is maintained constant below the melting temperature of the compound in stoichiometric proportions. These conditions cause quantities of the compound to precipitate out of the liquid alloy and to grow epitaxially on the substrate. With this mechanism, a wide variety of semiconductor devices may be made.

While the invention has been particularly shown and described with reference to a preferred embodiment thereof, it will be understood by those skilled in the art that various changes in form and details may be made therein without departing from the spirit and scope of the invention.

What is claimed is:

1. The method of forming semiconductor bodies in binary intermetallic compounds comprising the steps of placing in contact with a monocrystalline substrate of a semiconductor compound having a first melting temperature a quantity of an alloy of said semiconductor compound having an excess of a lesser volatile element therein, said alloy melting at a temperature lower than said first temperature and lower than the melting temperature of said compound in stoichiometric proportions heating said alloy to its melting temperature and introducing at that temperature, a quantity of the more volatile element of said compound from a gaseous medium causing thereby quantities of said compound in stoichiometric proportions to grow upon the substrate.

2. The method of forming zinc arsenide ($ZnAs_2$) semiconductor bodies comprising positioning a quantity of N conductivity type monocrystalline zinc arsenide ($ZnAS_2$) of a particular conductivity type in contact with an alloy of 60% zinc, 40% arsenic, heating the combination of said zinc arsenide and said alloy to a temperature of 755° C. thereby melting said alloy and introducing arsenic to the molten alloy from a gas while maintaining the alloy in a molten condition.

3. The method of causing epitaxial precepitation of stoichiometric binary element intermetallic semiconductor compounds comprising the steps of forming a molten region in a monocrystalline quantity of a binary element intermetallic semiconductor compound having a first melting temperature, said molten region being composed of an alloy of said compound that contains an excess of a less volatile constituent element thereof and has a melting temperature lower than said first melting temperature and lower than the melting temperature of the said compound in stoichiometric proportions and then introducing from a gaseous environment at a constant temperature lower than the melting temperature of said compound in stoichiometric proportions a quantity of a more volatile constituent of said compound into said molten region, thereby changing the composition of said molten region in the direction toward establishing the constituents in stoichiometric proportions.

References Cited in the file of this patent

UNITED STATES PATENTS

| | | |
|---|---|---|
| 2,798,989 | Welker | July 9, 1957 |
| 2,847,335 | Gremmelmaier et al. | Aug. 12, 1958 |
| 2,849,343 | Kroger et al. | Aug. 26, 1958 |
| 2,900,286 | Goldstein | Aug. 18, 1959 |